United States Patent [19]

Brighton

[11] Patent Number: 4,979,010
[45] Date of Patent: Dec. 18, 1990

[54] VLSI SELF-ALIGNED BIPOLAR TRANSISTOR

[75] Inventor: Jeffrey E. Brighton, Stafford, Tex.

[73] Assignee: Texas Instruments Incorporated, Dallas, Tex.

[21] Appl. No.: 393,077

[22] Filed: Aug. 9, 1989

Related U.S. Application Data

[63] Continuation of Ser. No. 334,741, Apr. 5, 1989, abandoned, which is a continuation of Ser. No. 885,995, Jul. 16, 1986, abandoned.

[51] Int. Cl.$^5$ .............................................. H01L 29/72
[52] U.S. Cl. ........................................ 357/34; 357/59
[58] Field of Search .......................... 357/59 H, 34, 49

[56] References Cited

U.S. PATENT DOCUMENTS

| | | | |
|---|---|---|---|
| 3,379,584 | 4/1968 | Bean et al. | 357/48 |
| 4,157,269 | 6/1979 | Ning et al. | 357/59 |
| 4,381,953 | 5/1983 | Ho et al. | 357/59 |
| 4,495,512 | 1/1985 | Isaac et al. | 357/34 |
| 4,583,106 | 4/1986 | Anantha et al. | 357/59 |
| 4,686,763 | 8/1987 | Thomas et al. | 357/59 H |

FOREIGN PATENT DOCUMENTS

| | | |
|---|---|---|
| 0166923 | 1/1986 | European Pat. Off. . |
| 0168324 | 1/1986 | European Pat. Off. . |
| 0170250 | 2/1986 | European Pat. Off. . |
| 2508704 | 6/1981 | France . |

OTHER PUBLICATIONS

S. P. Gaur, et al., "Optimum Lateral PNP Transistor", vol. 26, No. 9, Feb. 1984, pp. 4584–4585.

Primary Examiner—Andrew J. James
Assistant Examiner—Mark Prenty
Attorney, Agent, or Firm—B. Peter Barndt; James T. Comfort; Melvin Sharp

[57] ABSTRACT

A self-aligned bipolar transistor in which an emitter polysilicon layer is used to align both an extrinsic base region and a deep collector contact. The diffused extrinsic base is separated from the diffused emitter region by an oxide sidewall segment. Doping of the extrinsic base and the emitter is achieved by diffusion from doped overlying polysilicon loayers. The resultant structure is size limited primarily by the metal pitch of the leads.

12 Claims, 16 Drawing Sheets

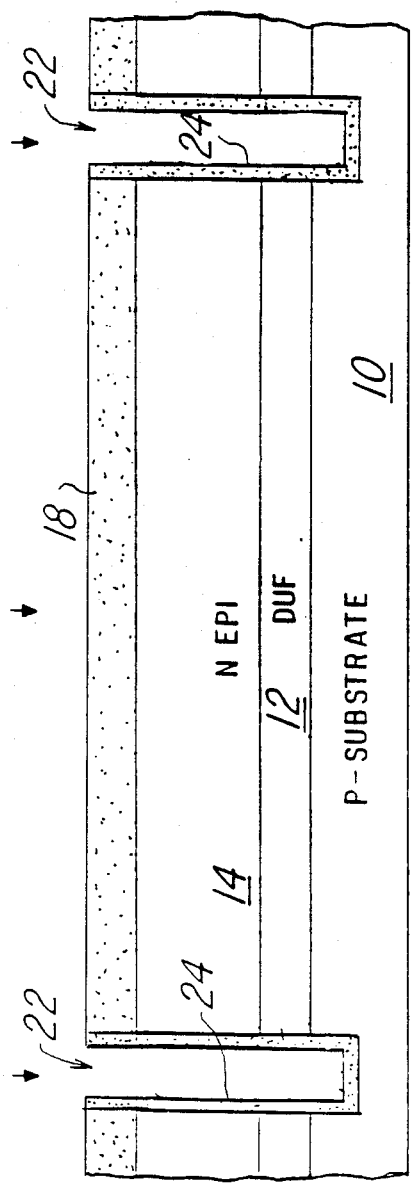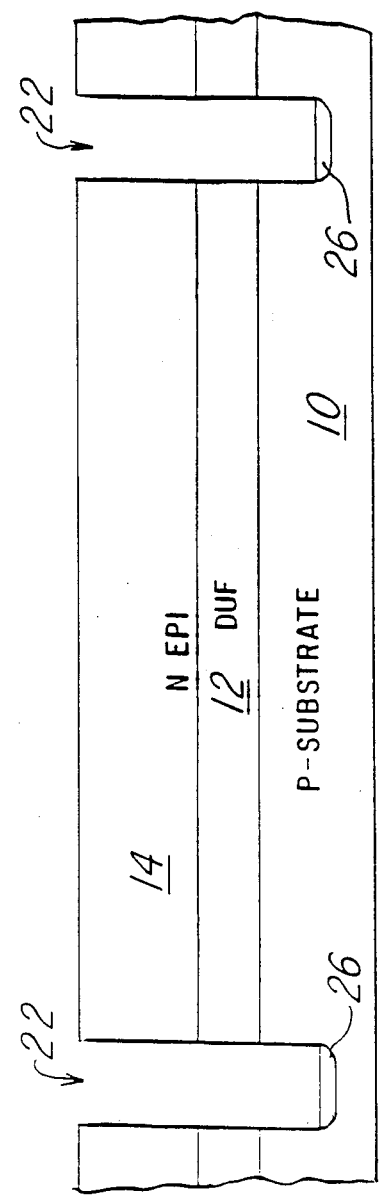

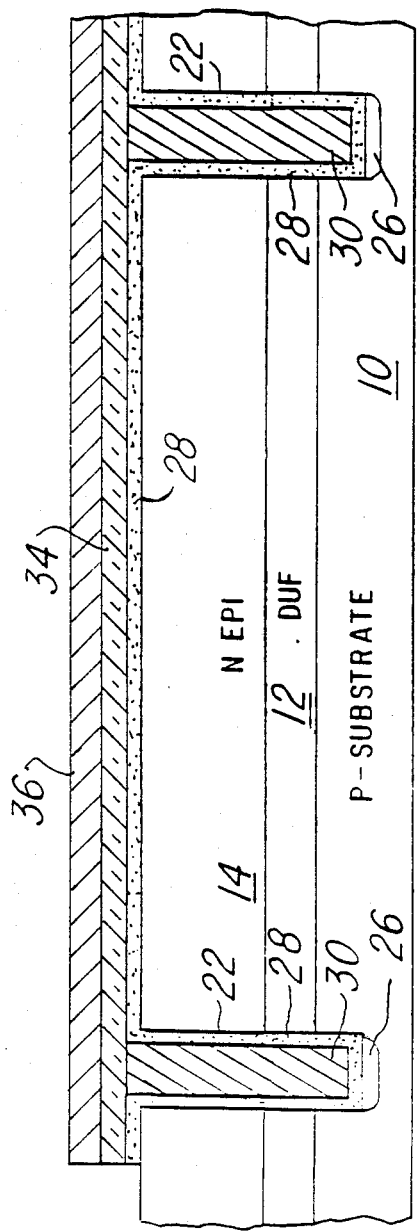
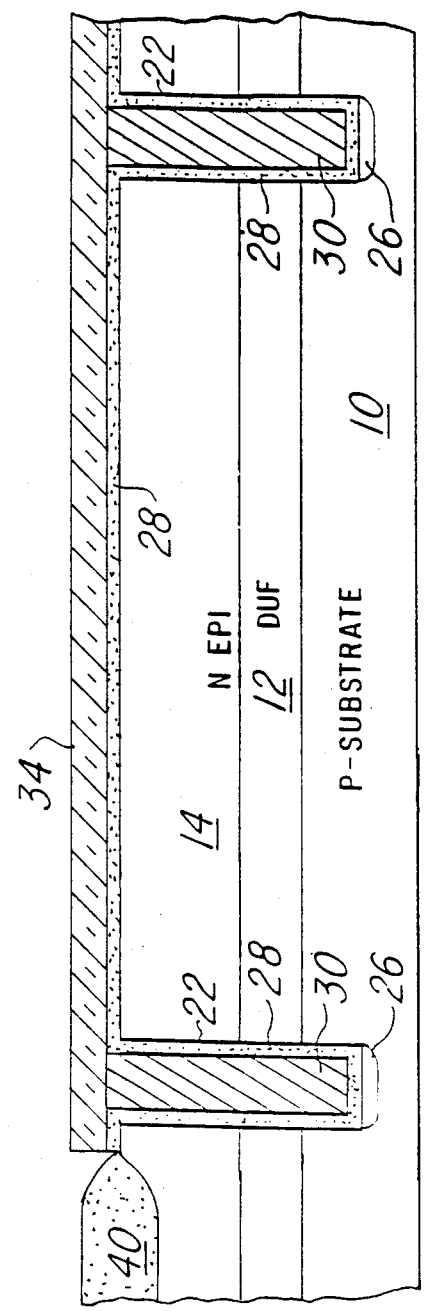

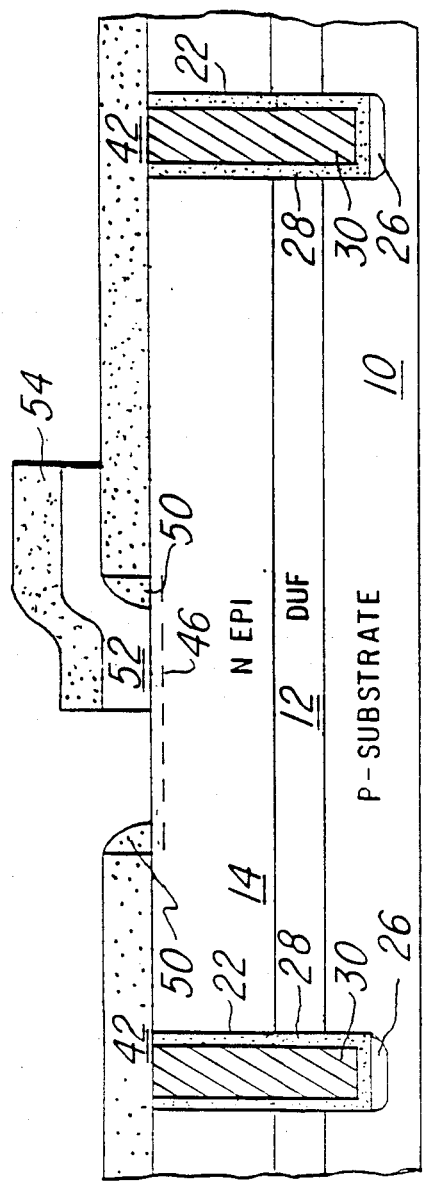
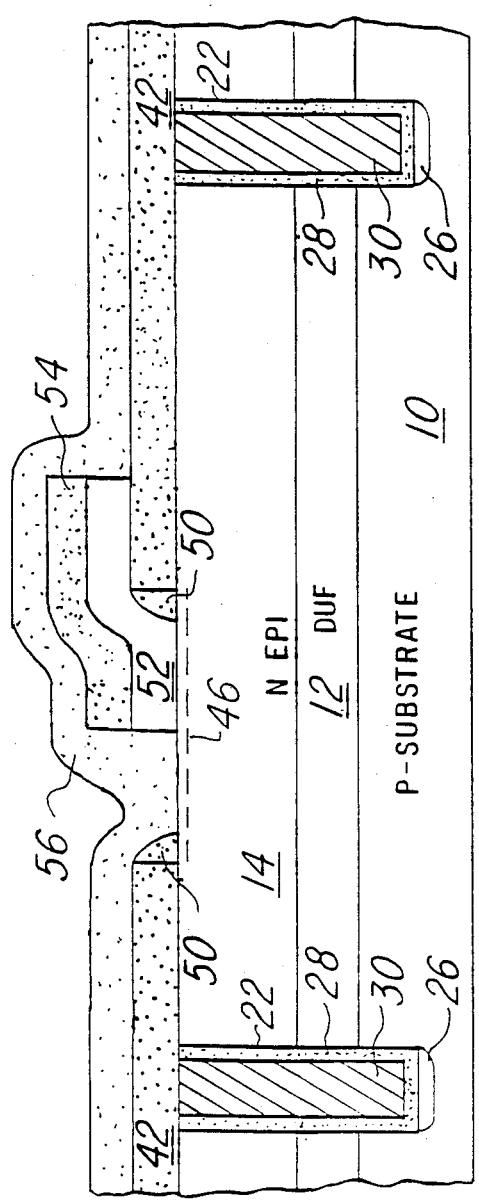
Fig.17
Fig.18

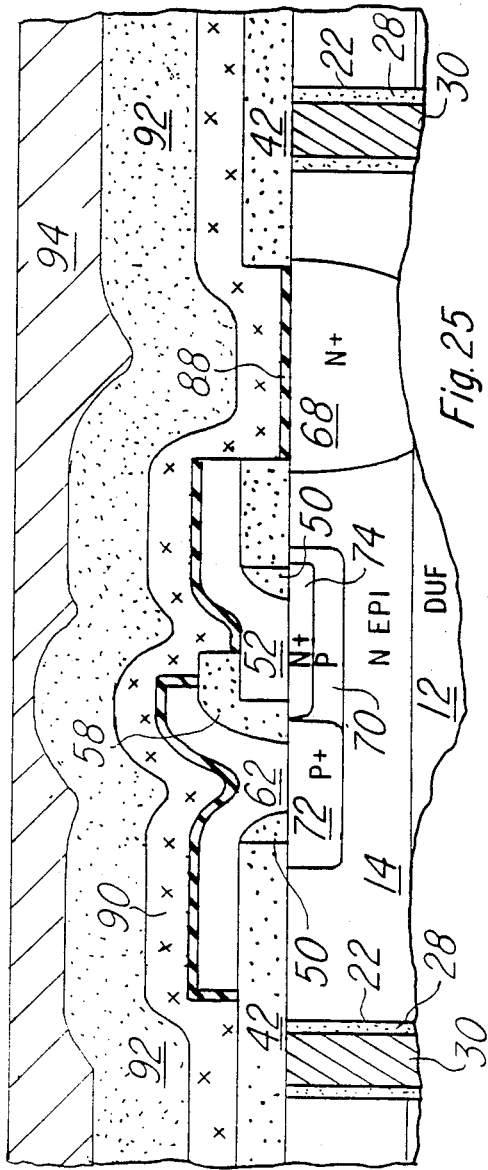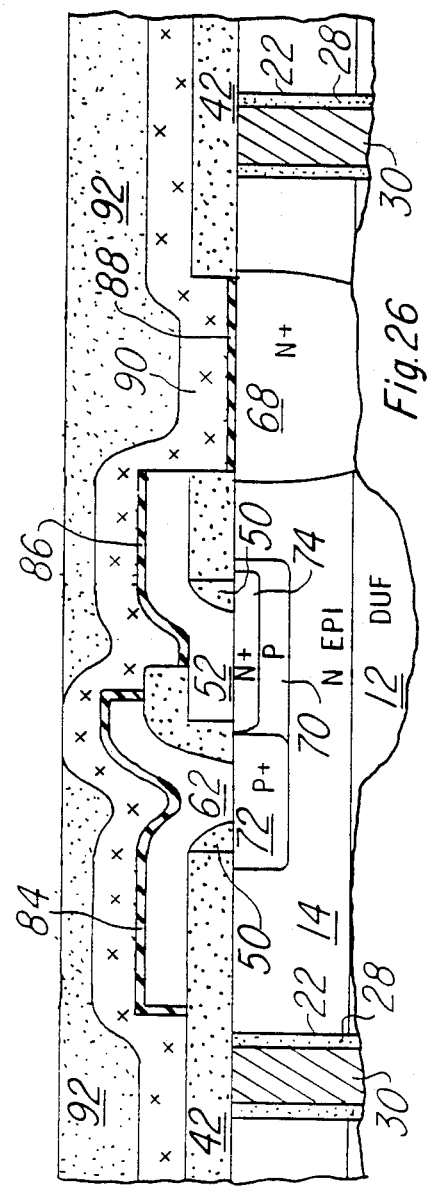

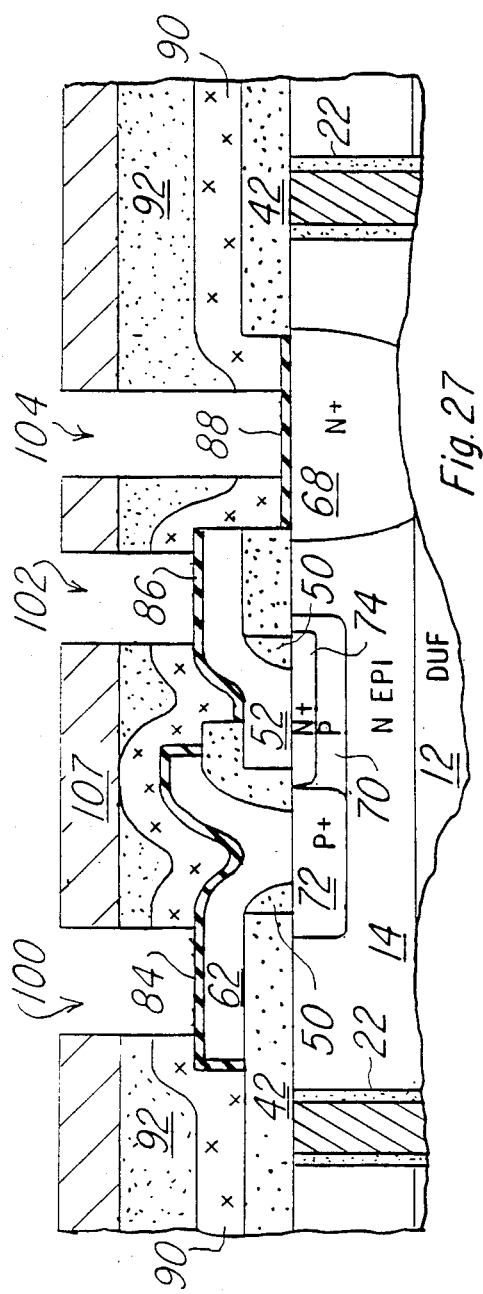
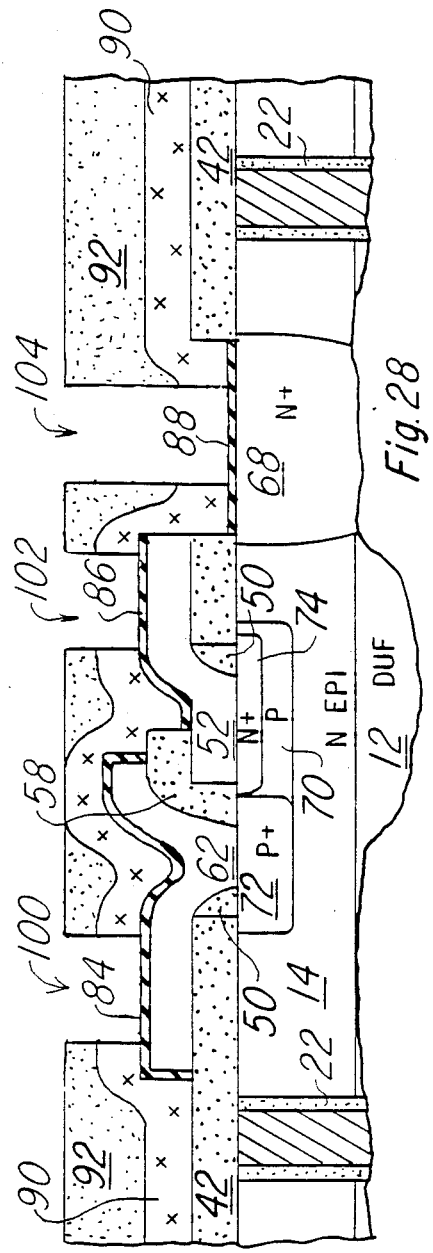

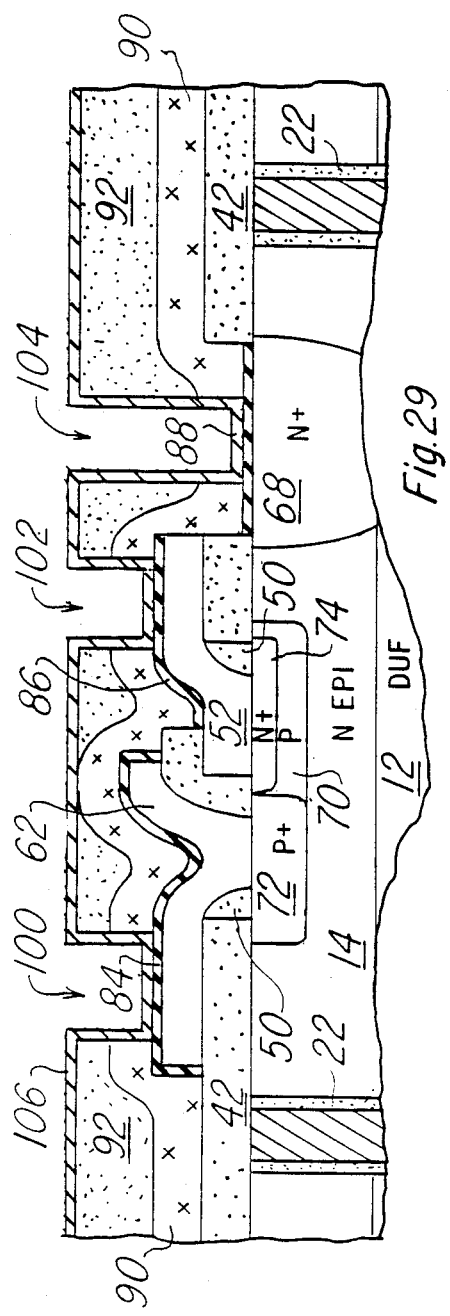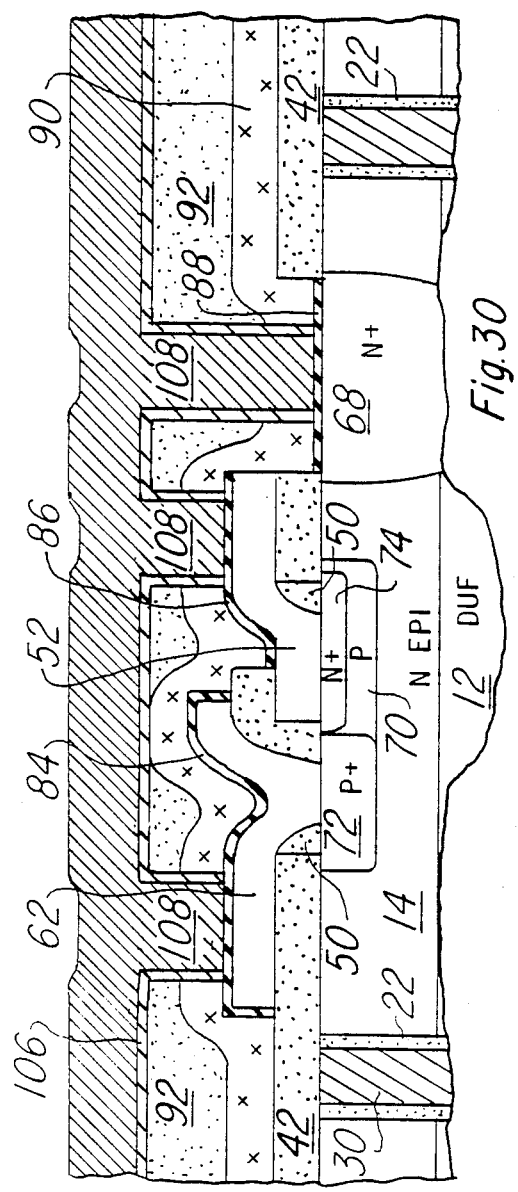

VLSI SELF-ALIGNED BIPOLAR TRANSISTOR

This application is a continuation of application Ser. No. 071334,741, filed April 5, 1989 and now abandoned, which is a continuation of application Ser. No. 885,995, filed July 16, 1986, now abandoned.

BACKGROUND OF THE INVENTION

The present invention relates to a bipolar transistor and method for making same which is self-aligned and capable of being fabricated with small cell size.

The direction of progress in bipolar integrated circuit technology is towards higher levels of integration and greatly reduced transistor cell size. The consequence of reduced cell size is a reduction in the parasitic resistances and capacitances which limit device performance. Since about 1978 various polysilicon self-alignment techniques have been developed in order to achieve such a reduced cell size. While each polysilicon self-aligned device has its own unique characteristics all of them are based on the concept of self-aligning an emitter to an edge of a polysilicon base contacting layer. A common problem with each of these techniques is that a P+ doped polysilicon layer must be etched or otherwise removed from a single crystalline silicon region in which an emitter is to be subsequently formed. Any defects induced in the emitter area during the P+ etch or during intermediate processing steps prior to emitter formation will degrade the device characteristics. Consequently, known polysilicon self-aligned processes are very complex.

A Cuthbertson et al. in an article entitled "Self-Aligned Transistors with Polysilicon Emitters for Bipolar VLSI" published in IEEE Trans. Electron Devices, v. ED-32, No. 2, pp 242-247, February, 1985, discloses a transistor structure in which the P+ inactive base region is self-aligned to a polysilicon emitter and which defines the emitter region early in the fabrication sequence making the emitter less susceptible to surface defects. Furthermore, the single crystal silicon region on which polysilicon is removed is an inactive device area, so dry etch induced damage is less critical. However, in the Cuthbertson et al. transistor, the spacing between the diffused P+ and emitter junctions is defined by thermally oxidizing the edge of the N+ polysilicon emitter which makes junction depth control very difficult. Moreover, the separation of the P+ base and N+ emitter is not sufficient to inhibit the formation of a P+N+ base-emitter junction which degrades the junction breakdown voltage and the low-current characteristics of the device.

Accordingly, it is a principal object of the invention to provide a bipolar transistor structure and method of fabricating such a structure which allows greater size reduction and improved performance than hitherto known structures. It is a further object of the present invention to provide an improved self-alignment method for forming the emitter and extrinsic base regions. Yet another object of the invention is to provide an improved method of forming a diffused collector contact region.

SUMMARY OF THE INVENTION

According to the invention there is provided a method of making a bipolar transistor on a transistor region of a semiconductor substrate of a first conductivity type, which includes forming a DUF (often referred to as diffusion under film) collector on a face of said substrate with an impurity of a second conductivity type opposite to the first conductivity type. Next an epitaxial layer of silicon of the second conductivity type is grown over the substrate and DUF collector. An isolation region is then formed around a transistor region of the epitaxial layer. An intrinsic base region is implanted with an impurity of the second conductivity type. An emitter polysilicon layer is doped with an impurity of the second conductivity type after being formed over the insulator layer and patterned such that a portion thereof contacts the epitaxial layer in an emitter region nested within said intrinsic base region. An extrinsic base region is aligned with the emitter polysilicon adjacent said to emitter region. A collector contact region is formed in said transistor region. The transistor region is then annealed to activate impurity regions, drive impurity from said emitter polysilicon into said epitaxial layer below and form diffused emitter, intrinsic and extrinsic base and collector contact regions in said epitaxial layer.

Preferably an insulating plug is formed on a sidewall of the emitter polysilicon to act as a spacer between the emitter and extrinsic base regions. A base polysilicon layer may be formed over the extrinsic base region and implanted with an impurity of the second conductivity type prior to the annealing step.

Silicide may be formed over the base and emitter polysilicon layers as well as the collector contact region in order to enhance ohmic contact and to reduce resistance along the polysilicon to a corresponding contact.

Advantageously, the isolation means is a deep narrow trench extending down through the epitaxial layer into the substrate and enclosing the transistor region.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 1 to 32 are greatly enlarged cross sectional views in elevation of a small portion of a semiconductor chip showing various stages in the fabrication of the bipolar transistor cell made in accordance with a preferred embodiment of the invention.

DETAILED DESCRIPTION OF A PREFERRED EMBODIMENT

Figure 32:
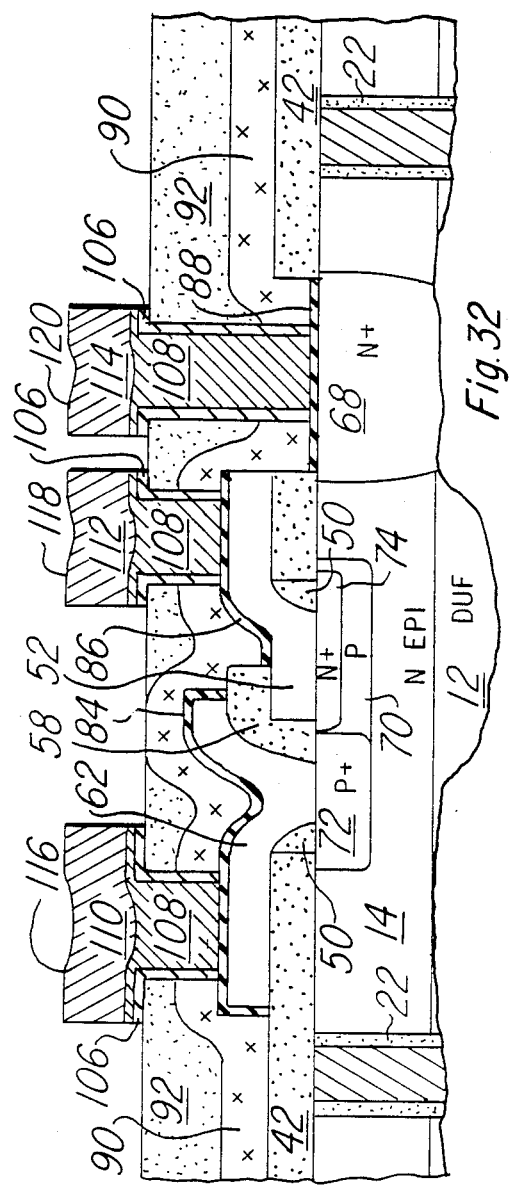

With reference to FIG. 32 there is shown in cross section a bipolar transistor being one of many formed on each of a number of silicon bars. The bars are formed from a silicon slice. In accordance with a preferred embodiment of the present invention each transistor consists of a monocrystalline P-type silicon substrate 10 having an N-type antimony implanted DUF collector region 12 extending a thickness of about 3 to 3.5 microns into the slice. An N-type epitaxial layer 14 is deposited over the DUF region 12 to a thickness of 1.0 to 1.4 microns. Polysilicon filled trenches 22 divide up the substrate 10 and epitaxial layer 14 into a number of regions in which bipolar transistors are formed. Each transistor consists of a heavily doped shallow intrinsic base region 70 extending down only 2,000 to 4,000 Angstroms brought to a surface contact by a heavily doped P+ region 72. The P+ region 72 is contacted by a layer of P+ polysilicon 62 with a thin film of platinum silicide 84 formed on top of the polysilicon 62 to enhance ohmic contact and reduce base resistance.

A shallow emitter 74 of about 500 to 2,000 Angstroms depth is formed in the base region 70 by diffusion from a phosphorous (or arsenic) doped polysilicon layer 52. A deep collector contact 68 is formed in the epitaxial region 14 to make contact with the DUF region 12 which acts as a buried collector. Again ohmic contact enhancement is provided by platinum silicide layers 86 and 88 to emitter polysilicon layer 52 and collector contact 68, respectively. Metal contacts 116, 118 and 120 consist of a thin sticking layers of titanium-tungsten 106 followed by tungsten plugs 108 and aluminum leads 110, 112 and 114. Alternatively, molybdenum could be used in place of the titanium tungsten.

Figure 1:
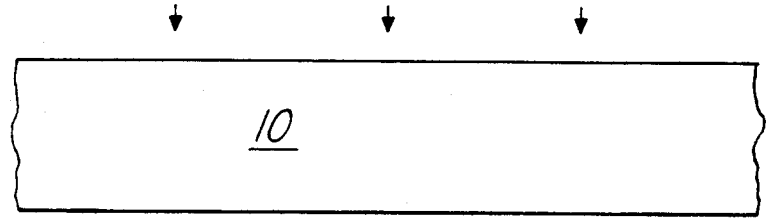
Figure 2:
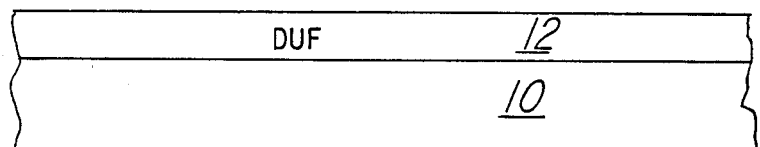
Figure 3:
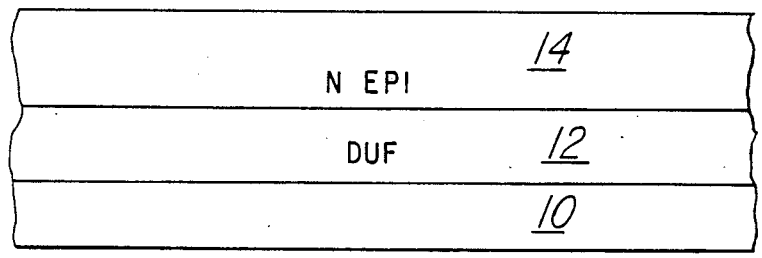

Referring to FIGS. 1, 2 and 3, a P-type substrate 10 is subjected to a blanket implant of antimony to a post anneal depth of 3 to 3.5 microns and a final sheet resistance of 15–20 ohms per square. Since antimony diffuses much more slowly in silicon than do other types of donor impurities such as phosphorus or arsenic, up-diffusion into the overlying epitaxial layer will be significantly less. Next as seen in FIG. 3, an N-type epitaxial layer 14 is deposited over the antimony implanted DUF region 12 at reduced pressure to a thickness of 1.0 to 1.4 microns with a resistivity of 0.3 to 1.0 ohm-cm. This thickness of epitaxial layer 14 is about 20% less than the thicknesses of epitaxial layers used in conventional technologies and requires shallow emitter and base regions.

Figure 4:
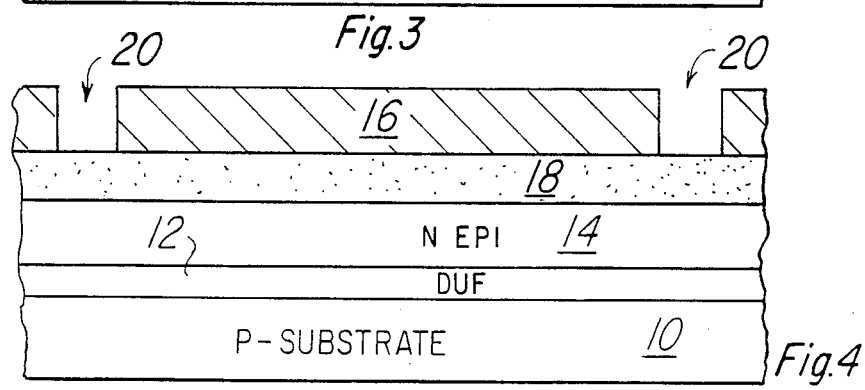

A layer of silicon dioxide 18 is then deposited to a thickness of about 1.0 to 1.5 microns. A layer of photoresist 16 is then deposited over the silicon dioxide 18, exposed to ultra violet light through a mask (not shown), and the exposed portions removed in order to open a number of spaced apart trench regions 20 as shown in FIG. 4. The trench regions 20 are then etched to form deep trenches 22 extending below the DUF region having a width of 1.5 to 2.0 microns. Next a sidewall oxide 24 is grown over the walls of the trenches 22 by placing the cell in an atmosphere of steam at a temperature of approximately 1,000° C. for about 15 minutes. A channel stop boron implant is then directed into the trenches 22 at an energy of 40 to 60 keV and a concentration of about $1 \times 10^{14}$ atoms per square centimeter to form a P+ channel stop region 26 below each trench 22 in order to prevent an inversion layer from forming around the trench oxide sidewall 20. An etch removes the layer of silicon dioxide 24 on the sidewalls of the trench 22 and the oxide 18 on the top of the epitaxial layer 14 as shown in FIG. 6. A second sidewall oxide is grown over the trench walls and face of the epitaxial layer 14.

Figure 7:
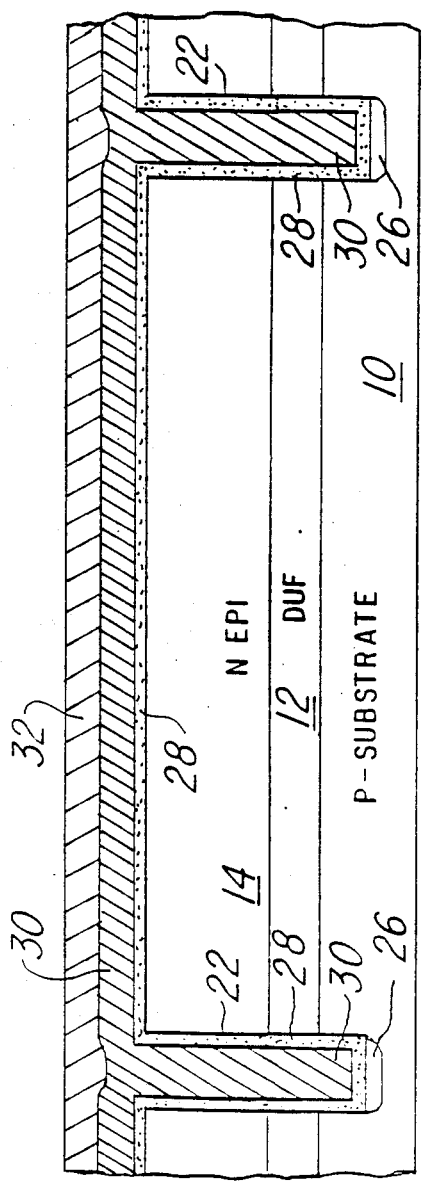
Figure 8:
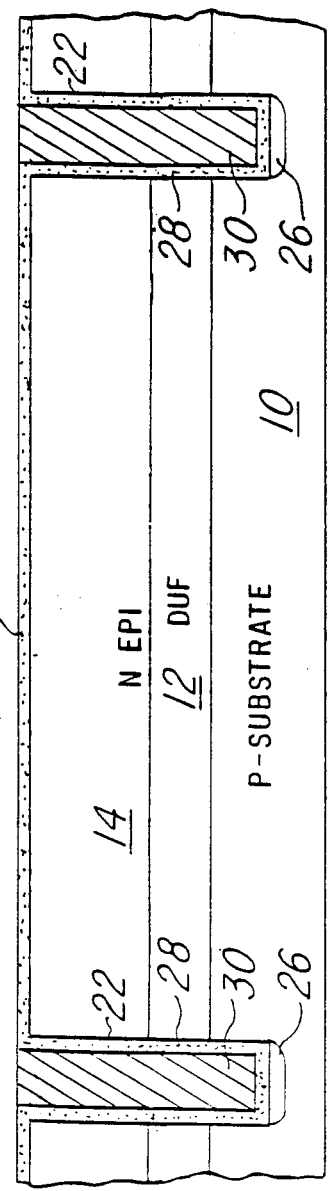
Figure 33:
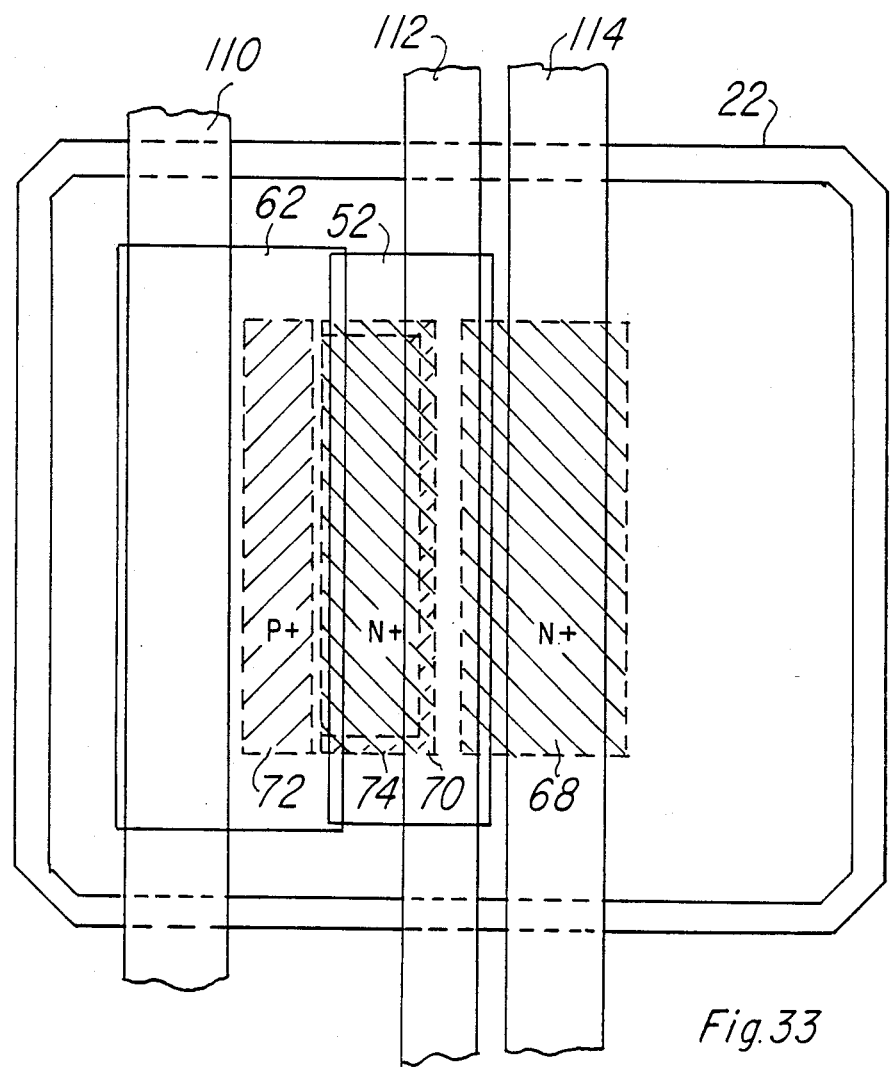
FIG. 33 is a greatly enlarged top view of a small portion of a semiconductor chip showing the physical layout of one bipolar transistor made in accordance with the present invention.

Next the trenches 18 are filled with a polysilicon deposit 30 as seen in FIG. 7 and onto the latter layer is deposited a layer of photoresist 32 which is flat. A dry etch chemistry is selected so that the photoresist 32 and underlying polysilicon 30 etch as substantially the same rate. Etching of the photoresist 32 and polysilicon 30 down to oxide layer 28, produces a flat oxide surface 28 as shown in FIG. 8. Referring to FIGS. 32 and 33 the design of the trenches is substantially rectangular with the corners angled off in order to preserve substantially the same channel width around the corners and avoid voids when filling with polysilicon. By using such trenches as isolation regions the oxide encroachment into the active device area present in devices using ordinary oxide isolation is avoided and the packing density can be increased significantly. In oxide isolation the current design rule requires a separation of 8–10 microns between transistors whereas with a polysilicon filled trench the 1.5 to 2.0 micron width of the trench is the limit in separation.

Referring to FIG. 9, a layer of silicon nitride 34 is formed over oxide surface 28 by low pressure chemical vapor deposition. A layer of photoresist 36 is deposited over the nitride 34 and then patterned and the exposed isolation region 38 etched to remove the nitride 30 and oxide 28 as seen in FIG. 10. The photoresist 36 is stripped and the entire slice is then exposed to an oxidizing high pressure atmosphere at about 900° C. for about 2 hours. During oxidation silicon is consumed so that a relatively thick oxidation isolation region 40 as seen in FIG. 10 is formed.

Figure 11:
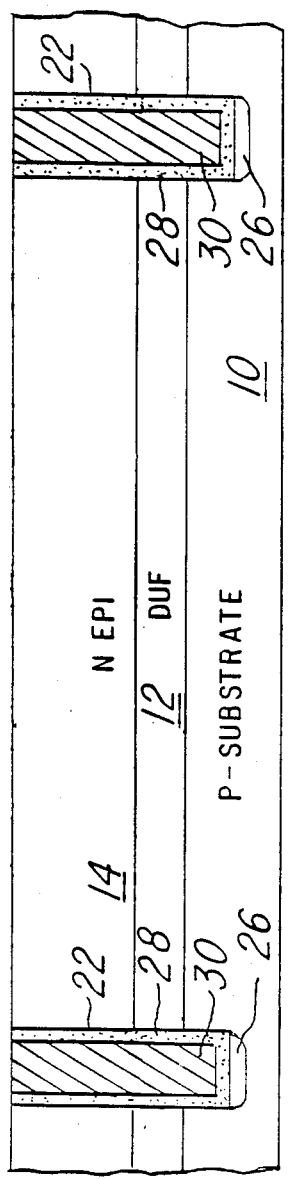
Figure 12:
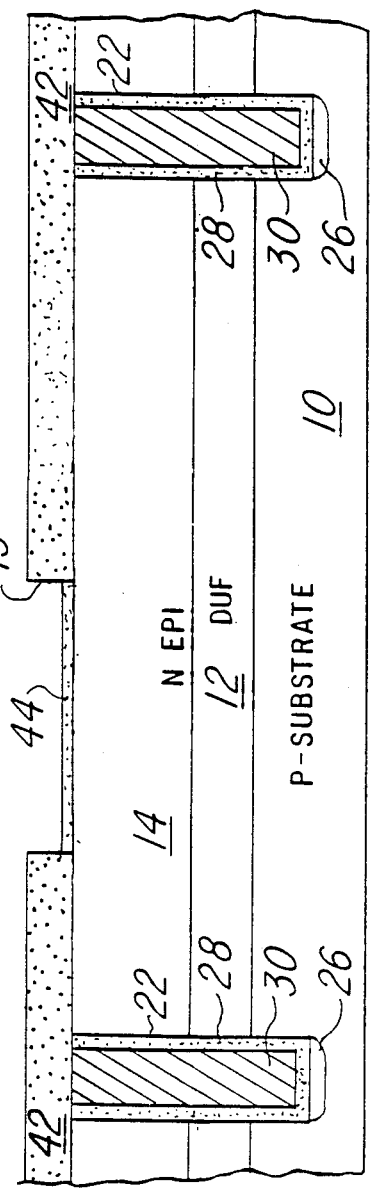
Figure 13:
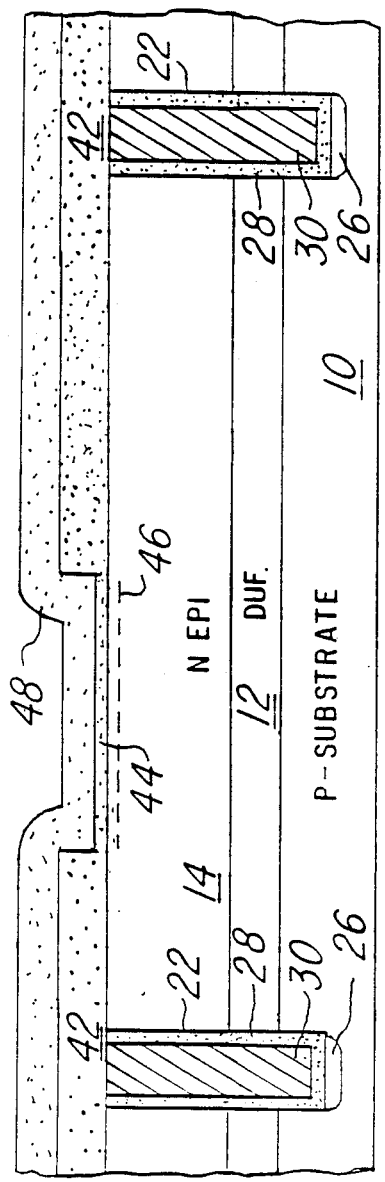
Figure 14:
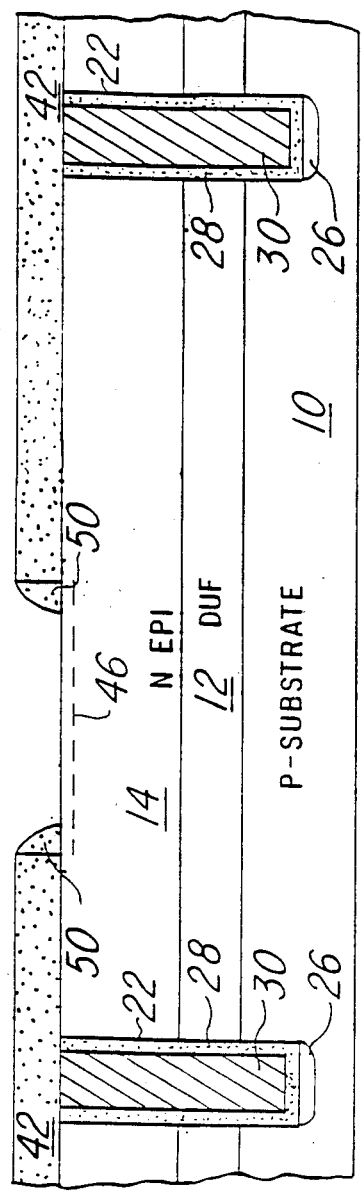
Figure 15:
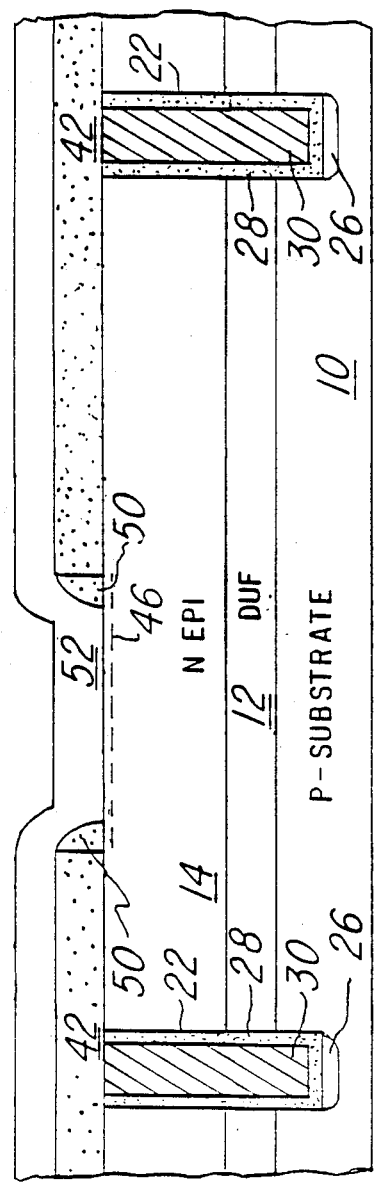
Figure 16:
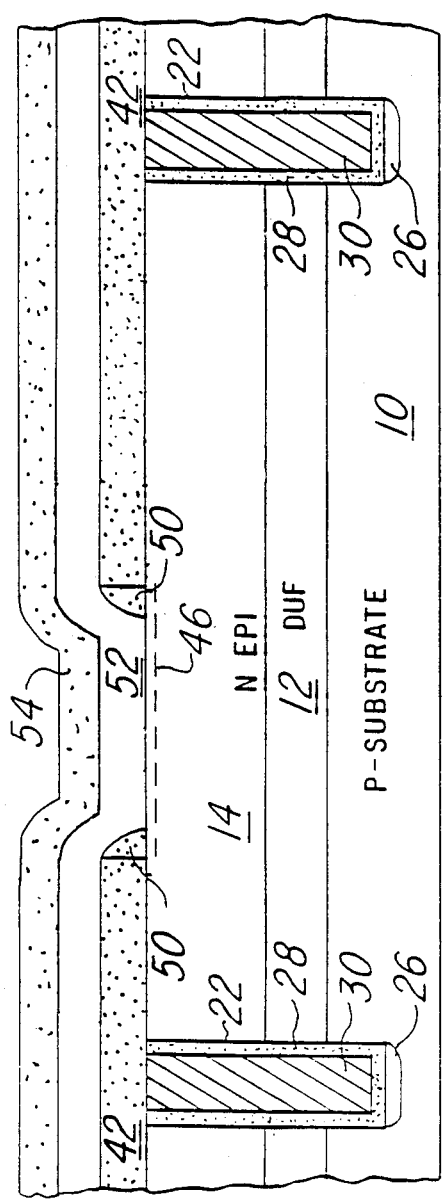
Figure 19:
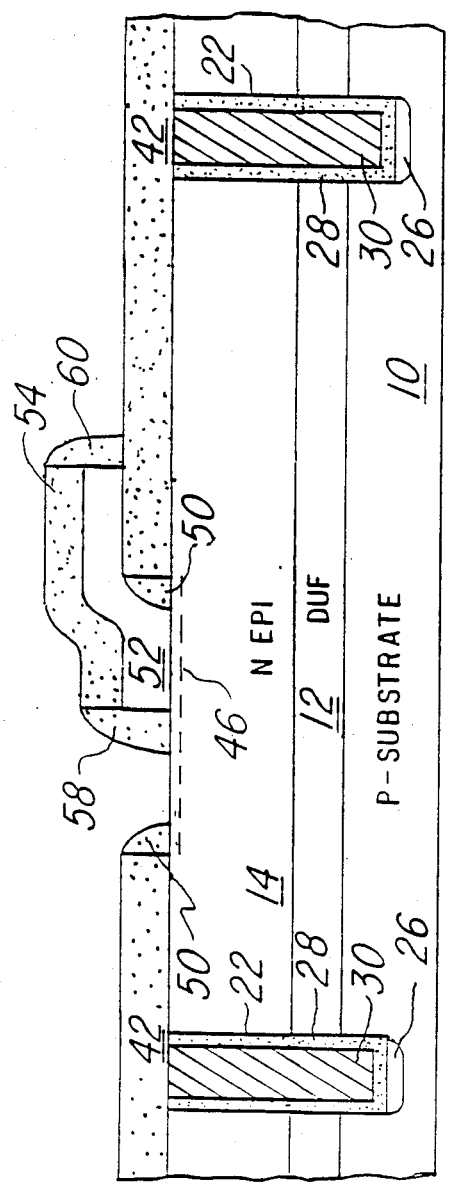

Next, as shown in FIG. 11 the remaining nitride 34 is etched off as is the oxide 28 over the epitaxial region 14. A layer of oxide is grown over epitaxial layer 14 to a thickness of about 3,000 to 5,000 Angstoms or deposited by known means and a base region 43 patterned and etched in the oxide 42 as shown in FIG. 12. A thin oxide 44 in the range of 500 to 1,200 Angstroms is grown over the exposed epitaxial surface in opening 43 and then the epitaxial surface implanted with boron 46 through the oxide 44 to a shallow depth. Following the boron implant another thick oxide layer 48 is deposited and a reactive ion etch done to leave sidewall segment 50 around opening 43. A polysilicon layer 52 is then deposited and doped with either phosphorous or arsenic followed by the deposition of another oxide layer 54. Segment 50 ensures a smooth gradual transition over the sidewalls of opening 43 and ensures that the emitter 74 will be nested within the intrinsic base region 70. Both the polysilicon 52 and the oxide 54 are patterned and etched opening an extrinsic base part of the epitaxial surface within opening 43 and leaving an emitter polysilicon layer 52 and an overlying oxide layer 54 as shown in FIG. 17. Another layer of oxide 56 is deposited over the transistor region, and subjected to reactive ion etching leaving sidewall plugs 58 and 60 as shown in FIG. 19.

Figure 20:
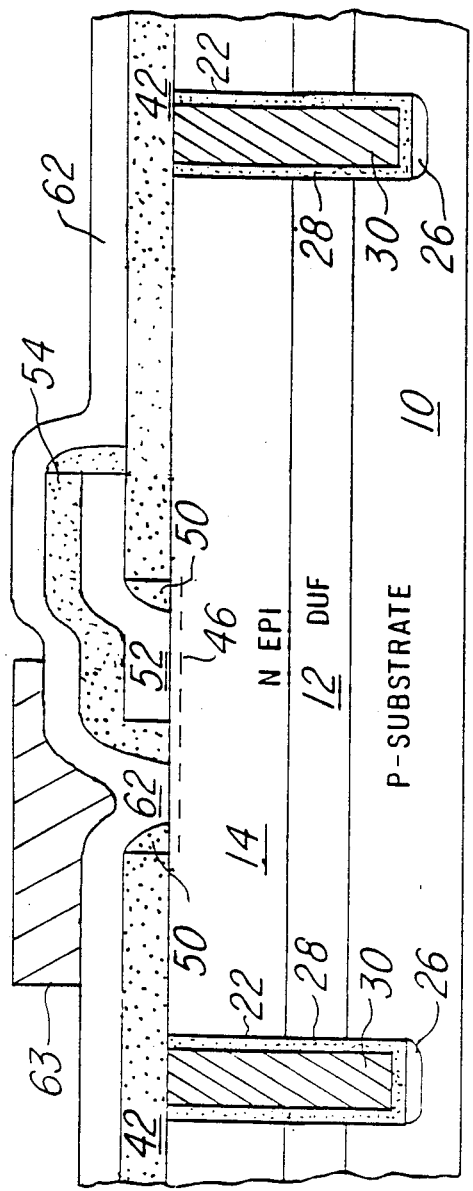
Figure 21:
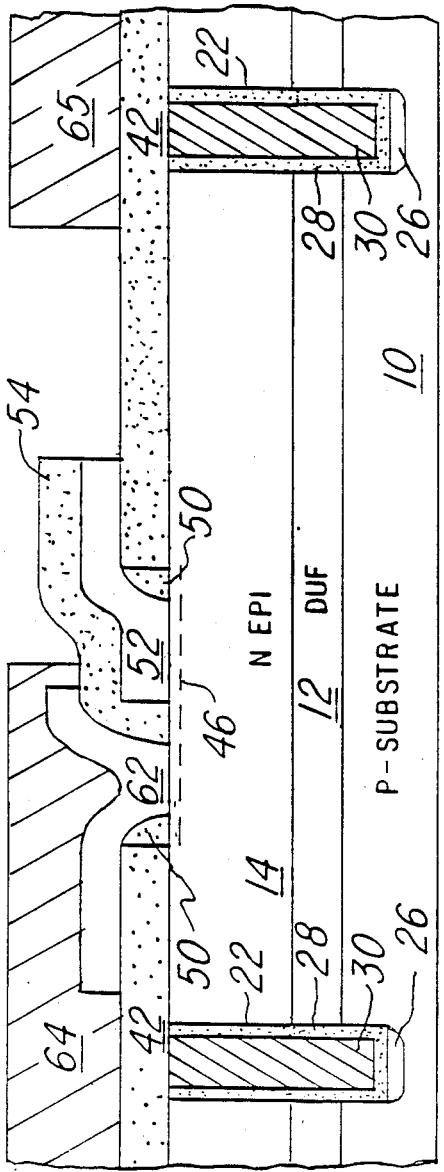
Figure 22:
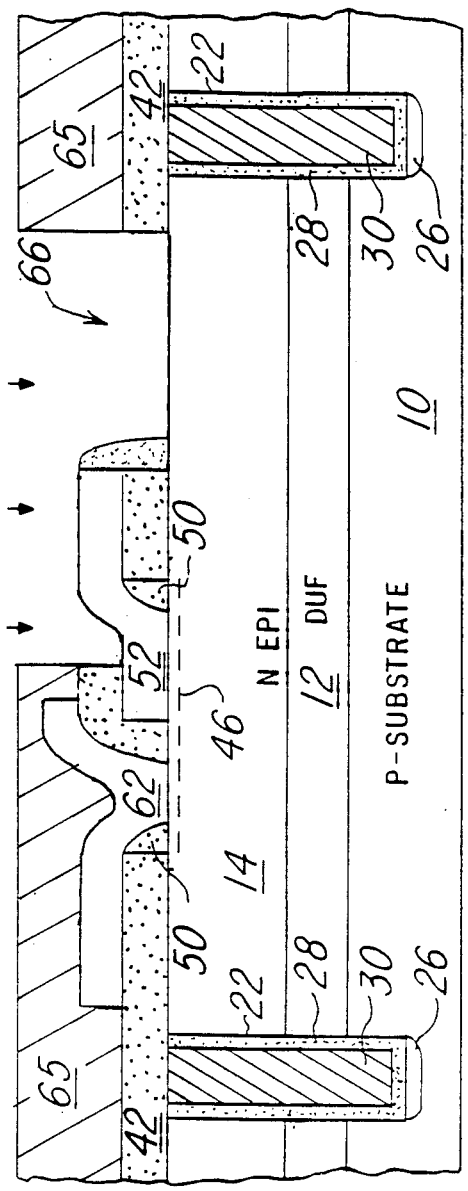
Figure 23:
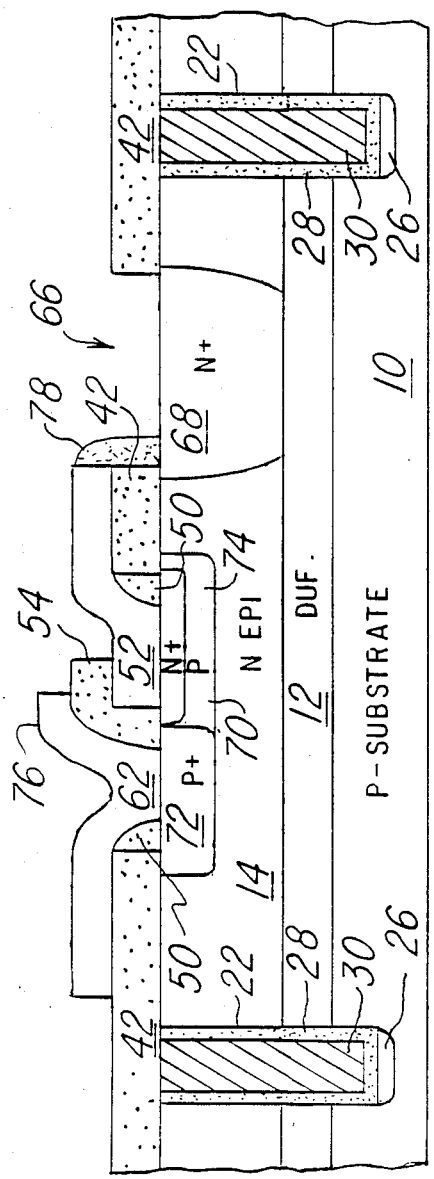

Following formation of sidewall plugs or segments 50 and 58, a second layer of polysilicon 62 is deposited and ion implanted with boron followed by a deposit of photoresist 63. Photoresist 63 is patterned as shown in FIG. 20 and the polysilicon layer 62 etched to leave a base polysilicon layer 62 as shown in FIG. 21. Photoresist layer 65 is deposited and patterned to leave an opening over a portion of oxide layers 54 and 42 and the oxide etched to expose both emitter polysilicon layer 52 and collector contact region 66 as shown in FIG. 22. A deep collector contact implant of phosphorous at an energy of 100 to 120 keV is effected with an implant dose in the range of $1 \times 10^{16}$ to $3 \times 10^{16}$ atoms per square centimeter using the same photoresist pattern. Alternatively the implant could be arsenic rather than phosphorous. The photoresist 65 is then stripped and the device given a short anneal to drive the dopant from the emitter and extrinsic base polysilicon layers 52 and 62, respectively, to activate and drive the phosphorous in the collector contact region, to activate and diffuse the intrinsic base boron implant 46, and to anneal implant damage. The resulting structure is shown in FIG. 23. The diffused P+ region 72 extends approximately 2,000 to 4,000 Angstroms below the silicon surface and has a sheet resistance of 80 to 100 ohms per square. The P-type region 70 resulting from the intrinsic implant extends down about the same distance as the extrinsic base region 72 and has a sheet resistance in the range of approximately 600 to 800 ohms per square. This high level of base doping reduces base resistance and hence decreases gate delay and switching time. All of the above junction depths and sheet resistance values are final process values.

Figure 24:
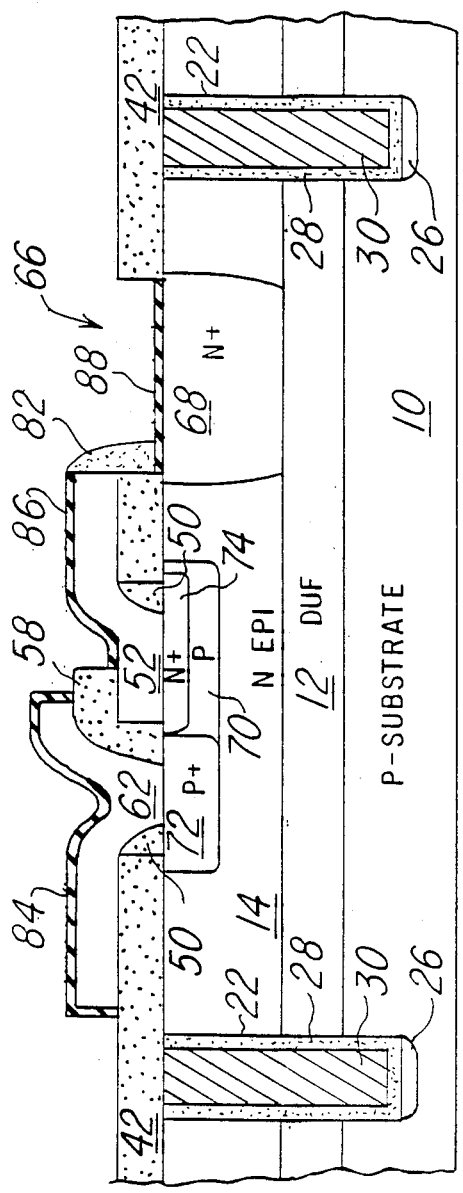

Referring to FIG. 24, platinum is sputtered over the surface of the transistor region and sintered so that in regions where platinum is in contact with silicon, platinum silicide is formed leaving silicide layers 84, 86, and 88. These silicide layers are formed on the collector contact region 68 in alignment with polysilicon layer 52 and on the latter in near alignment with base polysilicon layer 62. They serve to enhance ohmic contact of subsequently deposited metal layers as well as lower resistance along the layers of polysilicon.

Figure 31:
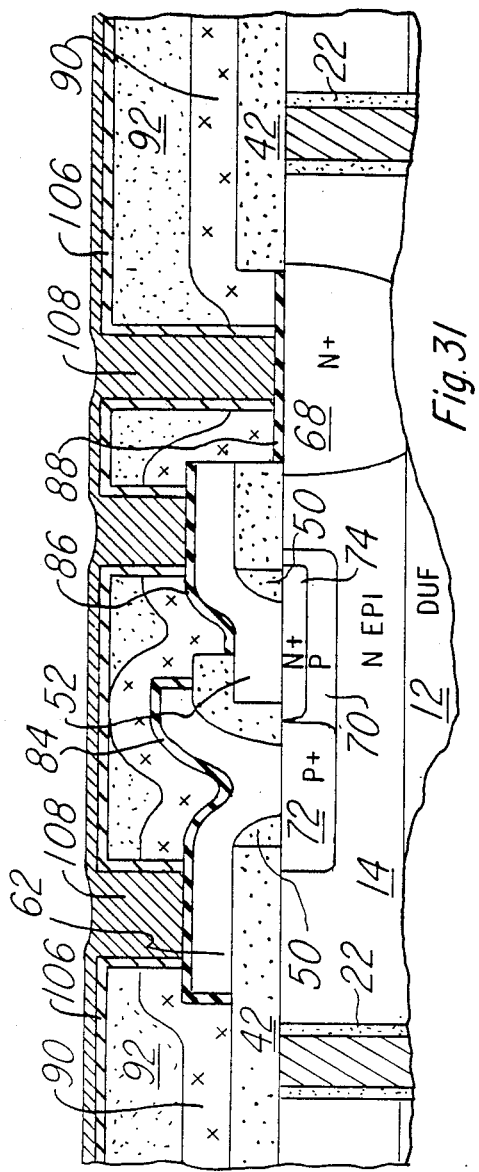

A conformal coating of phosphosilicate glass 90 is deposited over the structure of FIG. 24 to passivate the surface, followed by a thick layer of oxide 92 and a spun on layer of photoresist 94. Etching back the photoresist 94 and oxide 92 using a dry etch chemistry which produces substantially the same etch rate in the photoresist 94 as in the oxide 92 leaves a flat topped oxide 92 as shown in FIG. 26. Yet another photoresist layer 107 is deposited and patterned to open contact areas on the base polysilicon 62, the emitter polysilicon 52, and the collector contact 68. The underlying oxide 92 and PSG (phospho silicate glass) 90 is etched opening the latter-mentioned contact holes. Because the etch is highly selective and etches the silicide much more slowly than the oxide contact opening 104 which is deeper than contact openings 100 and 102 can be etched at the same time as the latter two openings. The photoresist is stripped leaving the structure of FIG. 28 and then a sticking layer of titanium-tungsten is sputtered onto the slice leaving an almost a conformal coating of titanium-tungsten 106. A thick layer of tungsten 108 is then chemically vapor deposited over the sticking layer 106 filling in openings 100, 102 and 104. Another photoresist layer (not shown) is deposited over the tungston 108 in a spin on process and then etched back with an etch chemistry having a 1:1 selectivity of tungsten to photoresist leaving only a thin relatively flat layer of tungsten 108 over the underlying oxide 90 as shown in FIG. 31. An aluminum layer is deposited over the remaining tungsten layer 108 and patterned and etched down to oxide 90 leaving leads 110, 112 and 114 as shown in FIG. 32.

A top view of the transistor region of a slice shown in FIG. 33 indicates the three leads 110, 112 and 114 running along the surface of the slice together with underlying base polysilicon 62 and emitter polysilicon 52. Also shown are diffused extrinsic base 72, emitter 74, intrinsic base 70 and collector contact 68. The trench structure as seen is angled at 45° to each side both on the outside and inside walls so as to maintain a constant width at the corners and avoid voiding in the polysilicon used to fill the trench.

It will be appreciated that both the extrinsic base and the collector contact regions are self-aligned with respect to opposed side walls of emitter polysilicon layer 52. Moreover, the emitter is nested within the intrinsic base via the self-aligned formation of sidewall plug 50, and the extrinsic base is spaced from the emitter by sidewall segment 58 thus allowing extremely close spacing without the formation of an undesirable P+N+ junction. The spacing between the collector contact region 68 and the emitter polysilicon layer 52 can also be made small due to the self-alignment method of defining the collector contact region.

The use of shallow junctions allows a thin epitaxial layer ot be used without increasing collector base capacitance significantly. A thin epitaxial deposit which in this case is about 1.0 to 1.4 microns reduces the collector resistance as well as the charge storage under the active base. The use of a deep collector implant followed by a short anneal provides a method of reducing the collector resistance to a greater extent than is possible by the conventional means of phosphorus-oxychloride diffusion as well as providing better control over diffusion profiles.

The use of antimony which diffuses much more slowly in silicon than do other impurities such as phosphorus limits the amount of up-diffusion of the buried collector or DUF region 14 and therefore allows a thinner epitaxial layer 12. The use of a deep narrow trench allows a substantially greater packing density by nearly an order of magnitude than would be possible with conventional oxide isolation.

Utilization of a high efficiency polysilicon diffused emitter, makes it possible to increase the active base doping. A heavily doped base, in turn means a lower base resistance and hence a lower gate delay or switching time. Moreover, using only a shallow base implant of boron and relying on diffusion of dopant from the polysilicon layers 62 and 52 into the extrinsic base 72 and emitter 74 avoids damage that would otherwise result if implants were made instead.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A bipolar transistor formed on a transistor region of a semiconductor substrate of a first conductivity type, comprising:

a bureid DUF collector on said substrate and an overlying epitaxial layer both of a second conductivity type;

an isolation region around said transistor region;

an intrinsic base region in said epitaxail layer of a first conductivity type;

an insulating layer over said epitaxial layer having a base contact opening;

a sidewall insulating plug on a sidewall of the insulating layer;

an emitter region of the second conductivity type nested within said intrinsic base region and an overlying emitter polysilicon layer in contact therewith, the emitter polysilicon layer formed in the base contact opening for use as an emitter dopant source for an emitter region below said polysilicon, said sidewall insulating plug used to space the emitter polysilicon layer from an edge of said insulating layer so that an emitter diffusion from said emitter polysilicon into said intrinsic base region is nested within said intrinsic base region due to the spacing effect of the sidewall sidewall insulating plug;

an extrinsic base region adjacent to said emitter region formed in alignment with said emitter polysilicon layer; and a collector contact region extending through said epitaxial layer to said DUF collector of the second conductivity type.

2. A biplar transistor according to claim 1, including an insulating spacer plug on a first sidewall of said emitter polysilicon layer.

3. A bipolar transistor according to claim 2, including a base polysilicon layer contacting said extrinsic base region in abuttment with said insulating spacer plug.

4. A bipolar transistor according to claim 2, wherein said DUF collector impurity is antimony, said first conductivity type is P-type and said second conductivity type is N-type.

5. A bipolar transistor according to claim 3, including a silicide layer formed over said emitter and base polysilicon layers and said collector contact region.

6. A bipolar transistor according to claim 1, wherein said isolation region is a trench extending down through said epitaxial layer into said substrate.

7. A bipolar transistor according to claim 1, including an insulating extrinsic base spacer plug on a second sidewall of said emitter polysilicon layer.

8. A bipolar transistor according to claim 7, including an electrically conductive extrinsic base contact formed subsequent to said emitter polysilicon layer and spaced from the latter by said extrinsic base spacer plug.

9. A bipolar transistor according to claim 1 wherein said DUF collector impurity is antimony, said first conductivity type is P-type and said second conductivity type is N-type.

10. A bipolar transistor according to claim 8, including a silicide layer formed over said emitter polysilicon layer and said collector contact region.

11. A bipolar transistor according to claim 1, wherein said isolation region is a trench extending down through said epitaxial layer into said substrate.

12. A bipolar transistor formed on a transistor region of a semiconductor substrate of a first conductivity type, comprising:

a buried DUF collector on said substrate and an overlying epitaxial layer both of a second conductivity type;

an isolation region around said transistor region;

an intrinsic base region in said epitaxial layer of a first conductivity type;

an emitter region of the second conductivity type nested within said intrinsic base region and an overlying emitter polysilicon layer in contact therewith;

an extrinsic base region adjacent to said emitter region formed in alignment with one edge of said emitter polysilicon layer; and a collector contact region extending through said epitaxial layer to said DUF collector of the second conductivity type, said collector contact region being formed in alignment with the opposite edge of said emitter polysilicon layer.

* * * * *